United States Patent [19]
Okamura

[11] Patent Number: 5,619,472
[45] Date of Patent: Apr. 8, 1997

[54] SEMICONDUCTOR MEMORY DEVICE WITH A PLURALITY OF BONDING PADS ARRANGED IN AN ARRAY

[75] Inventor: Junichi Okamura, Tokyo, Japan

[73] Assignee: Kabushiki Kaisha Toshiba, Kanagawa-ken, Japan

[21] Appl. No.: 535,409

[22] Filed: Sep. 28, 1995

[30] Foreign Application Priority Data

Nov. 10, 1994 [JP] Japan .................... 6-276259

[51] Int. Cl.⁶ .................. G11C 8/00; G11C 5/02
[52] U.S. Cl. .................. 365/230.03; 365/51; 365/226
[58] Field of Search .................. 365/230.03, 226, 365/94, 104, 51; 371/22.3

[56] References Cited

U.S. PATENT DOCUMENTS 5,355,369  10/1994  Greenberger et al. .................. 371/22.3
5,467,300  11/1995  Komarek et al. .................. 365/104

*Primary Examiner*—David C. Nelms
*Assistant Examiner*—Trong Quang Phan
*Attorney, Agent, or Firm*—Finnegan, Henderson, Farabow, Garrett & Dunner, L.L.P.

[57] ABSTRACT

A semiconductor memory comprising core blocks 1, 2, 3 and 4 each comprising memory cell arrays each having a plurality of memory cells in a matrix and sense amplifiers and decoders accompanying the memory cell arrays. An inter-block region is arranged among the core blocks wherein data signal lines, address signal lines and control signal lines are provided. Pad arrays IO Pad and A Pad each comprising a plurality of pads and buses IO Bus and A Bus are arranged among the core blocks. The buses A Bus are jogged in a connection region. The buses IO Bus and A Bus are arranged successively in the inter-block region and the data signal lines, the address signal lines and the control signal lines are connected to the buses A Bus and IO Bus in the inter-block region.

20 Claims, 15 Drawing Sheets

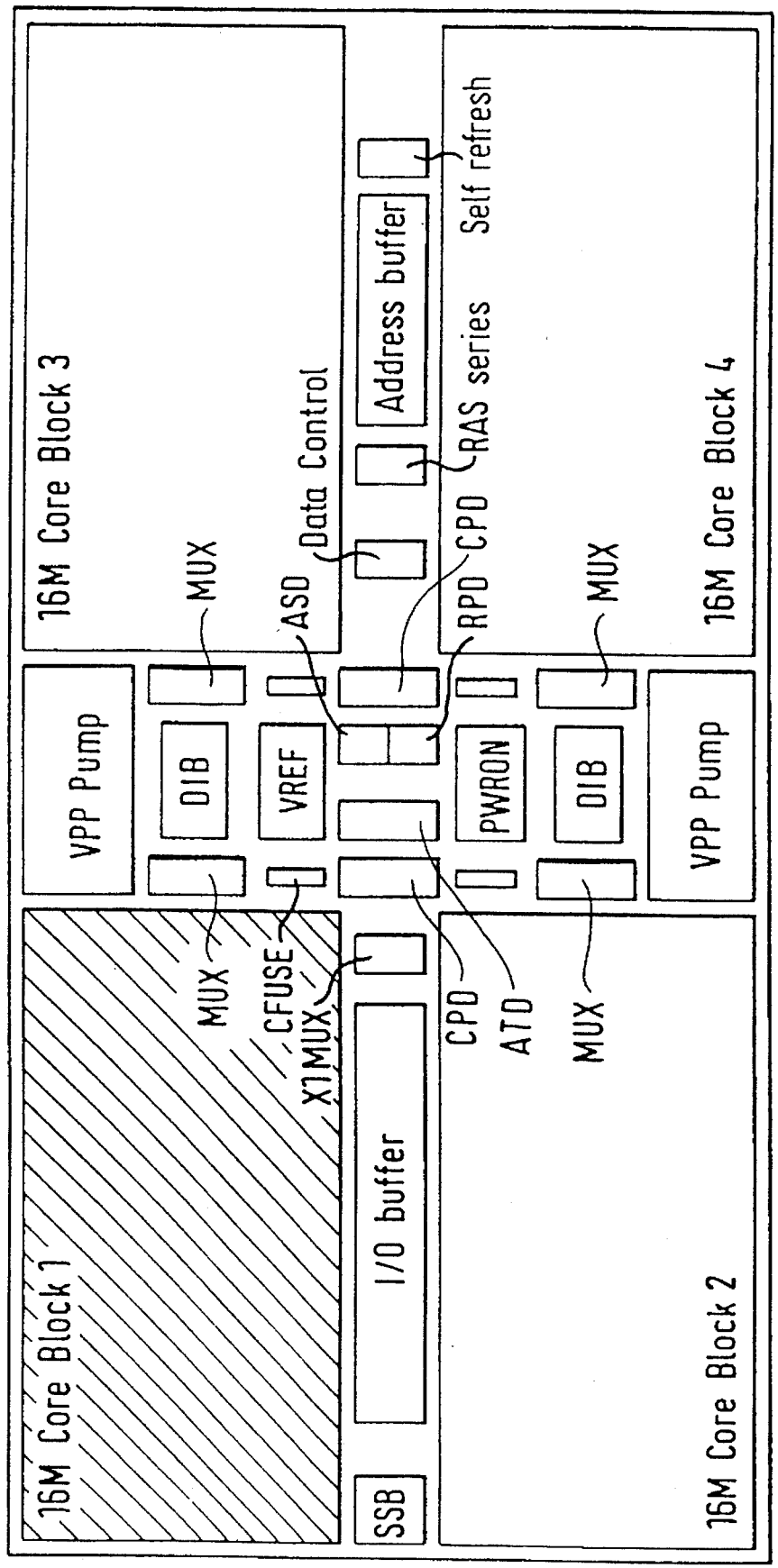
Fig. 10 Floor Plan

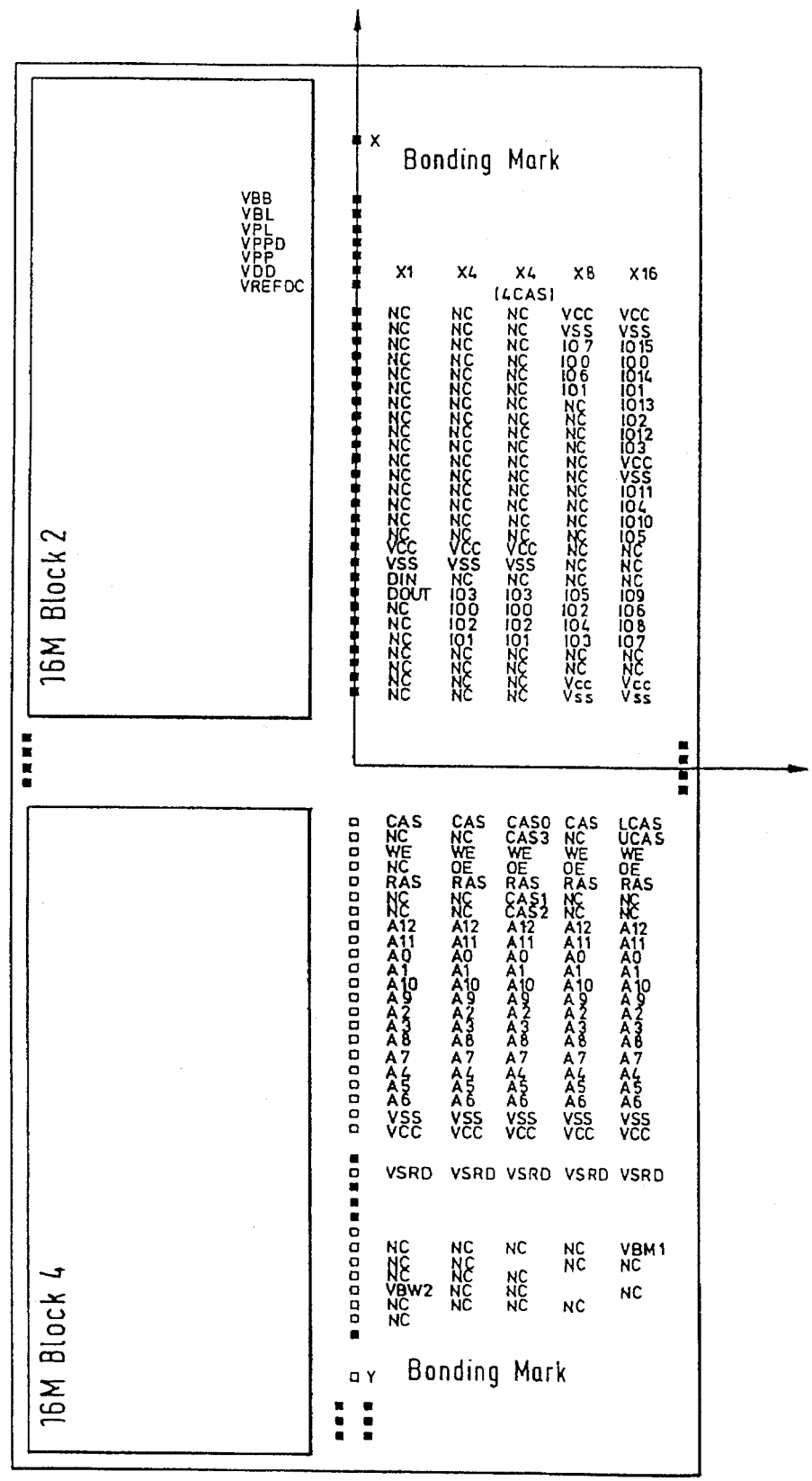
Fig. 11  PAD LOCATION

SEMICONDUCTOR MEMORY DEVICE WITH A PLURALITY OF BONDING PADS ARRANGED IN AN ARRAY

FIELD OF THE INVENTION

The present invention relates to a semiconductor memory, particularly to a dynamic-type memory having a center pad allocation.

BACKGROUND OF THE INVENTION

In a normal semiconductor memory, a plurality of pads are arranged at peripheral portions of a semiconductor chip wherein memory cells and the like are formed. These pads are connected to inner leads via bonding wires constituting transfer paths of signals from the outside of the chip.

In recent years, when a speedup requirement of access time is enhanced, a memory cell array is divided into a plurality of core blocks. In such a chip of a semiconductor memory, the speedup requirement cannot fully be met by a conventional pad allocation wherein the length of wirings is apt to cause delay.

An allocation wherein pads are provided at the central portion of the chip in rows (hereinafter, center pad allocation) may be considered as a method of resolving the above-mentioned problem. However, when this center pad allocation is used, the wirings are concentrated in the central portion of the chip whereby efficient wirings become very difficult.

As explained above, in the conventional semiconductor memory, pads are arranged at the peripheral portions of the chip, and therefore, the length of signal lines is apt to cause delay which makes speedup more difficult. When center pad allocation is used to meet the above-mentioned problem, the wirings are concentrated in the central portion of the chip whereby efficient wirings become very difficult.

SUMMARY OF THE INVENTION

It is an object of the present invention to resolve the above drawbacks and to provide a semiconductor memory wherein efficient wrings can be performed even with center pad allocation and a number of signal wirings are provided within a small area.

To achieve the above-mentioned object, the present invention provides a semiconductor memory comprising: a first, a second, a third and a fourth core blocks each comprising a memory cell array wherein a plurality of memory cells are arranged in a matrix and sense amplifiers and decoders accompanying the memory cell array; an inter-block region arranged between the first and the second core blocks and the third and the fourth core blocks wherein data signal lines, address signal lines and control signal lines are arranged; a first pad array comprising a plurality of pads arranged between the first and the second core blocks; a second pad array comprising a plurality of pads arranged between the third and the fourth core blocks; first and second buses extending to the inter-block region along both sides of the first pad array; third and fourth buses extending to the inter-block region along both sides of the second pad array; and a connection region arranged between the second pad array and the inter-block region; wherein the third and the fourth buses are jogged in the connection region to pass between the first and second buses in the inter-block region, the data signal lines, the address signal lines and the control signal lines being connected to the first, the second, the third and the fourth buses in the inter-block region.

In another aspect of the present invention, there is provided a semiconductor memory comprising: a first pad array having a plurality of bonding pads arranged linearly; a second pad array having a plurality of bonding pads arranged linearly, wherein the bonding pads in the first pad array and the bonding pads in the second pad array are collinear; a first bus arranged beside the first pad array, extending into an inter-pad region between ends of the first pad array and the second pad array; and a second bus arranged beside the second pad array and being jogged near the end of the second pad array to extend into the inter-pad region arranged beside the first bus in the inter-pad region.

Still in another aspect of the present invention, there is provided a semiconductor device comprising: a first bus; a second bus arranged parallel to the first bus; a first pad array located between the first and second buses, the first pad array having a plurality of bonding pads arranged linearly; a second pad array located between the first and second buses, the second pad array having a plurality of bonding pads arranged linearly, a connection region between the first pad array and the second pad array; a third bus arranged along a side of the first bus remote from the first pad array, the third bus extending beside the first pad array and into the connection region; a fourth bus arranged along a side of the second bus remote from the first pad array, the fourth bus extending beside the first pad array and into the connection region; a fifth bus arranged along a side of the first bus remote from the second pad array, the fifth bus extending beside the second pad array; a sixth bus arranged along a side of the second bus remote from the second pad array, the sixth bus extending beside the second pad array;

seventh and eighth buses positioned between the first and the second buses in the connection region; a first connection path for electrically connecting the fifth bus and the seventh bus near an end of the second pad array proximate the connection region; and a second connection path for electrically connecting the sixth bus and the eighth bus at the edge of the second pad array.

Still in another aspect of the present invention, there is provided a semiconductor device comprising: a first bus; a second bus arranged in parallel to the first bus; a first pad array located between the first and second buses, the first pad array having a plurality of bonding pads arranged linearly; a second pad array located between the first and second buses, the second pad array having a plurality of bonding pads arranged linearly, a connection region between the first pad array and the second pad array; a third bus arranged along a side of the first bus remote from the first pad array, the third bus extending beside the first pad array and into the connection region; a fourth bus arranged along a side of the second bus remote from the first pad array, the fourth bus extending beside the second pad array and into the connection region; a fifth bus arranged along a side of the first bus remote from the second pad array, the fifth bus extending beside the second pad array; a sixth bus arranged along a side of the second bus remote from the first pad array, the sixth bus extending beside the first pad array; seventh and eighth buses positioned between the first and the second buses in the connection region; a first connection path for electrically connecting the fifth bus and the seventh bus near an end of the second pad array proximate the connection region; and a second connection path for electrically connecting the sixth bus and the eighth bus near the end of the first pad array proximate the connection region.

According to the means of the present invention, the connection region is arranged between the second pad array and the inter-block region where the third and the fourth buses are bent in a swastika shape and the third and the fourth buses are inserted into the first and the second buses. As a result, the four buses are extended in parallel and even when the data signal lines, the address signal lines and the control signal lines are extended from any positions in a direction orthogonal to that of the buses, it is possible to connect these signal lines to the buses. It is not necessary to intersect these respective signal lines and therefore, the area of wiring connection is not uselessly increased. Further, an interval corresponding to the pads is provided between the first and the second buses and therefore, even when the first and the second buses are linearly arranged, it is possible to insert the third and the fourth buses into the interval between the first and the second buses in the inter-block region by which the allocation of wirings can be performed with a minimum area. This corresponds to connecting any core blocks to the respective pads with a minimum length of wiring which is preferable for the speedup of the semiconductor memory.

BRIEF DESCRIPTION OF THE DRAWINGS

FIG. 10 is a plan view of a third embodiment of the present invention;

FIG. 11 is a plan view showing a pad allocation in the third embodiment of the present invention;

DETAILED DESCRIPTION OF THE PREFERRED EMBODIMENTS

An explanation will be given of a semiconductor memory of the present invention in reference to the drawings as follows. Although the present invention can naturally be used in various semiconductor memories (SRAM, EPROM, MROM (mask read only memory) etc., an explanation will be given of an example of a DRAM as follows.

Figure 1:
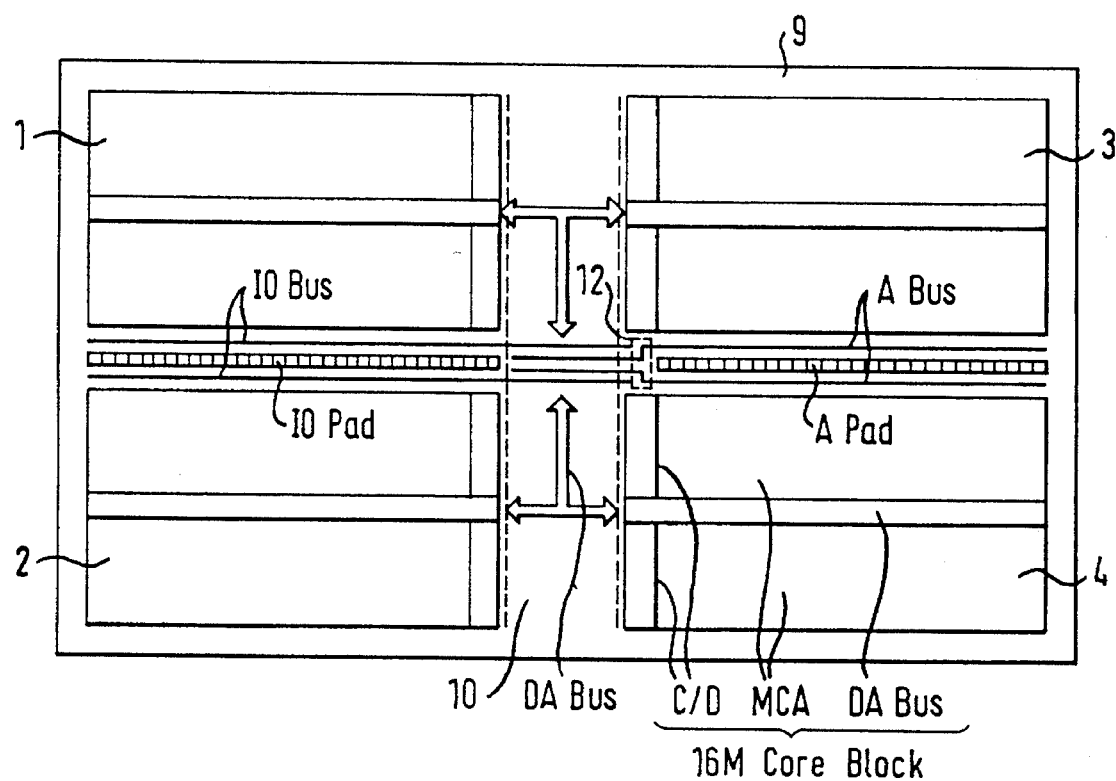
FIG. 1 is a plan view of a semiconductor memory showing a first embodiment of the present invention.

FIG. 1 shows an outline structural view of a DRAM constructed in accordance with the present invention. The total memory capacity is assumed to be that of a 64M bit DRAM. Core blocks 1, 2, 3 and 4 each constituted by 16M bits of memory cells and peripheral circuits within a core section such as sense amplifiers, decoders and the like which accompany the memory cells, are arranged in a semiconductor chip 9. Each core block is constituted by two memory cell arrays MCA between which a data address path DA Bus having multiple data signal lines, multiple address signal lines and multiple control signal lines are arranged. Further, column decoders C/D are arranged in each block on the side of the center of the chip. An inter-block region 10 is disposed between the core block 1 and the core block 2, and the core block 3 and the core block 4 wherein various peripheral circuits are arranged. Data address buses DA Bus having multiple data signal lines, multiple address signal lines and multiple control signal lines are arranged on the inter-block region 10 and connected to corresponding signal lines in the core blocks respectively, or via multiplexer circuits. An IO pad array IO Pad that is a first pad array is arranged between the core block 1 and the core block 2. This first pad array includes power source pads and data input/output pads. An address pad array A Pad that is a second array is arranged between the core block 3 and the core block 4. This second pad array includes power source pads, address input pads, control signal (for example, /RAS, /CAS etc.) input pads and the like. A connection region 12 is provided between the address pad array A Pad and the inter-block region 10. This connection region 12 is provided by shortening a small portion of the length of the address pad array A Pad on the side proximate the center of the chip. Four buses proceeding from the pad arrays toward the inter-block region 10 are provided wherein a first and a second bus IO Bus are arranged above and below (as viewed in FIG. 1) the IO pad array and a third and a fourth bus A Bus are arranged above and below (as viewed in FIG. 1) the address pad array, respectively. The first and the second buses are constituted by IO lines or the like and the third and the fourth buses are mainly constituted by address signal lines and control signal lines. The respective buses extend to the inter-block region 10 and the third and fourth buses are bent through two bends, e.g., at the connection region 12, i.e., to introduce a jog in the path of each bus, and disposed to fit in the space between the first and the second buses. As a result, the respective buses are arranged in parallel with each other in the inter-block region 10.

The first through fourth buses extend in parallel with each other by the above-mentioned construction and even if data signal lines, address signal lines and control signal lines extend from any position in a direction orthogonal to the direction of the buses, it is possible to connect such signal lines to the buses. It is not necessary to intersect these respective signal lines or to increase the area for the wiring connection. Further, since there is a space corresponding to the pads between the first and the second buses, even when the first and the second buses are arranged linearly, it is possible to insert the third and the fourth buses into the space between the buses in the inter-block region so that the wirings can be allocated with a minimum area. That is, the above arrangement contributes to a reduction in the chip area of the DRAM. The degree of the reduction in area is larger than the degree of increase in the connection region 12 which is provided by eliminating a portion of the pad array A Pad. Further, these effects correspond to connecting any core blocks to the respective pads with a minimum wiring length that is preferable for the speedup of the DRAM.

Figure 2:
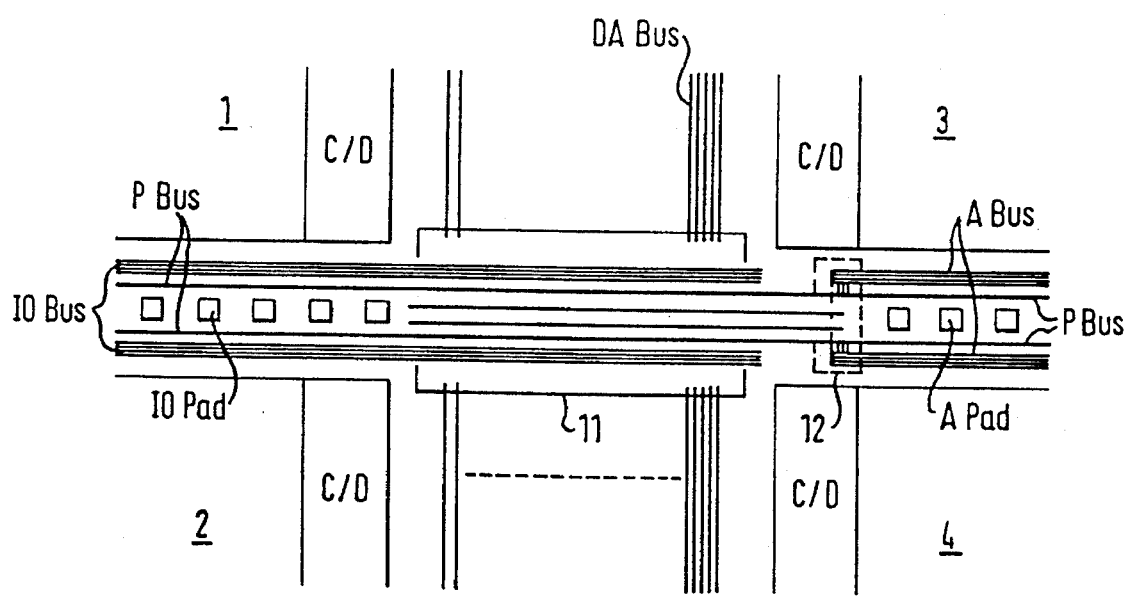
FIG. 2 is a plan view of the semiconductor memory of the first embodiment showing portions in detail.

FIG. 2 shows a detailed view of a central portion of FIG. 1. Power source buses P Bus which are not shown in FIG. 1 in view of the size of the drawing, are shown in FIG. 2. The power source buses P Bus are constituted by a first and a second bus including a ground line Vss and a power source line Vcc. These power source lines linearly extend from one end to the other end of the pad arrays IO Pad and A Pad in parallel with the long side of the chip. The power source buses P Bus are arranged between the pad arrays and the first, the second, the third and the fourth buses. As shown in FIG. 2, the buses are arranged in the order of the power source bus, and the other buses (IO bus, address bus) in increasing distance from the pad array. In the inter-block region 10, the buses are arranged from top to bottom as viewed in FIG. 2 as the first bus, the first power source bus, the third bus, the fourth bus, the second power source bus and the second bus. In the connection region 12, the third bus traverses the first power source bus and the fourth bus traverses the second power source bus. In a connection region 11, the data address bus DA Bus, the first through the fourth buses and the respective first and second power source buses are connected to respectively corresponding signal wirings and the like.

Figure 3:
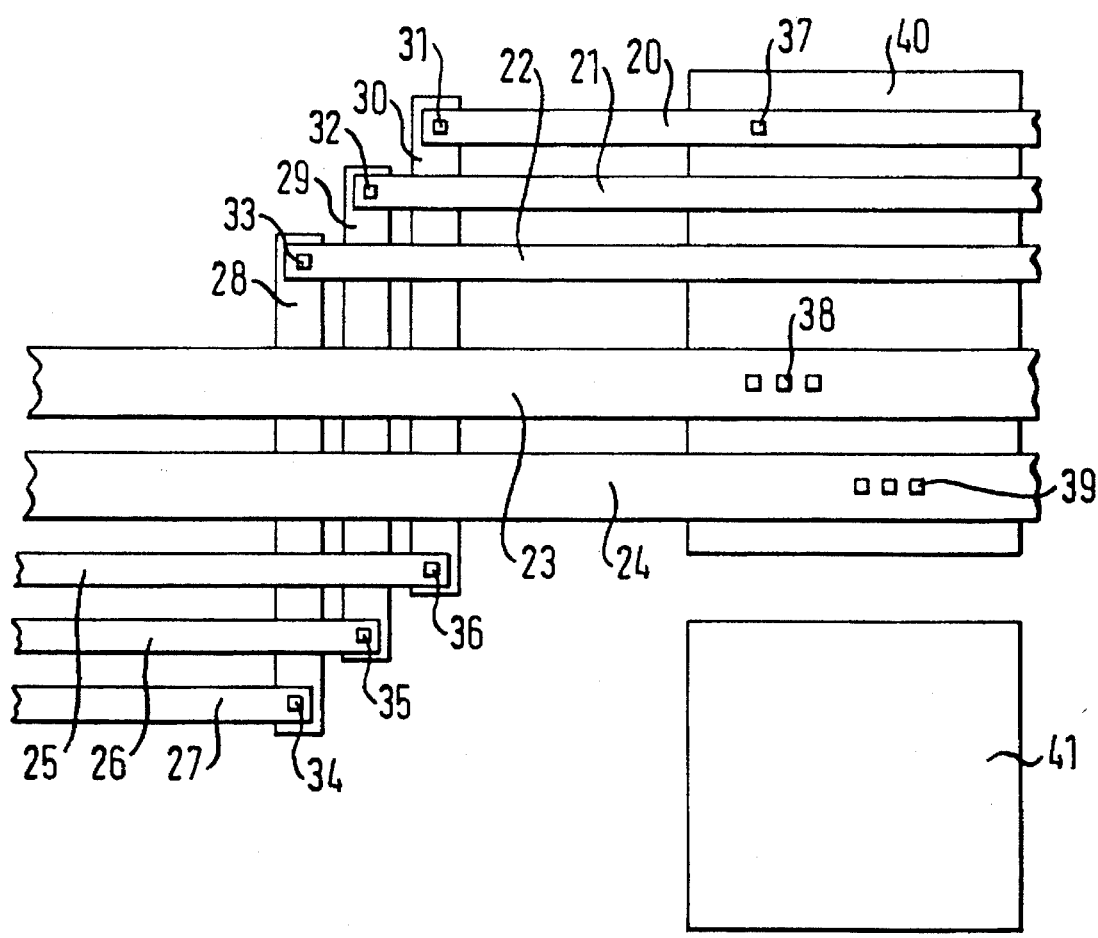
FIG. 3 is a plan view of the semiconductor memory of the first embodiment showing further details of portions of FIG. 2.

FIG. 3 illustrates details of the region surrounding the connection region 11 of FIG. 2. In this semiconductor memory first and second layers of metal wirings are used and the wirings 23 and 24 as the power source buses, and the wirings 20, 21, 22, 25, 26 and 27 as the remaining buses are constituted in the second layer of metal wirings. All of the connection wirings 28, 29 and 30 are constituted in the first layer of the metal wirings since they have to cross over the wirings 23 and 24 as the power source buses by using a different layer. The metal wirings 28, 29 and 30 of the first layer are connected to the metal wirings 20, 21, 22, 25, 26 and 27 of the second layer via contact regions 31, 32, 33, 34, 35 and 36. Further, an input or output circuit 40 is respectively provided below the buses 20–22 and the power source buses 23 and 24 for each corresponding pad 41. The input/output circuit 40 is connected to the bus 20 via a contact region 37 and is connected to the power source buses 23 and 24 via contact regions 38 and 39. The given chip area can effectively be utilized by arranging the input/output circuit 40 as shown in FIG. 3. This is because the power source necessary for the circuit can be provided by the wirings just above the circuit and output or input signals of the circuit 40 can be provided from the wirings just above the circuit. Further, the input/output circuit 40 can be constituted within a small area since the power source lines are arranged between the pads and the input/output signal lines.

Figure 4:
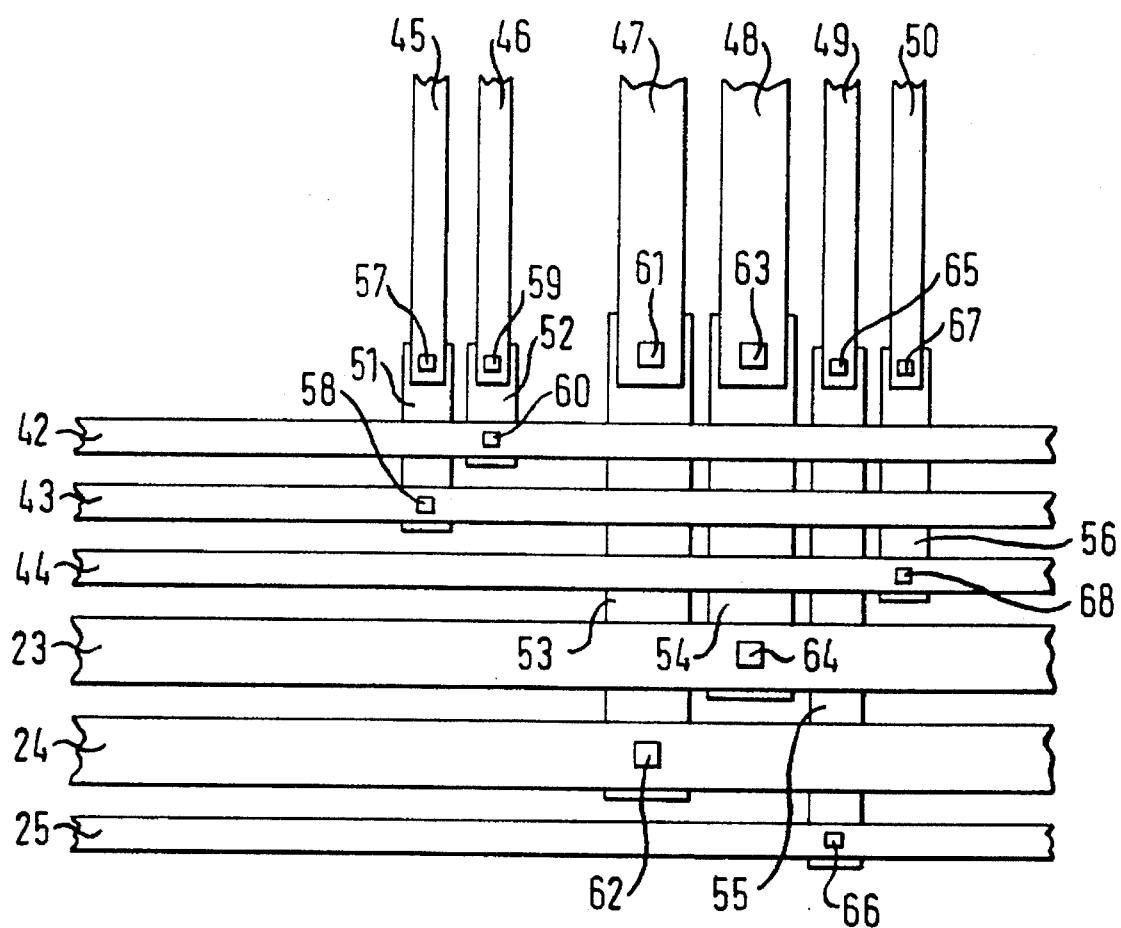
FIG. 4 is a plan view of the semiconductor memory of the first embodiment showing further details of portions of FIG. 2.

FIG. 4 shows in greater detail the region surrounding the connection region 11 of FIG. 2. Wirings 42, 43 and 44 corresponding to the first bus are arranged in parallel with the power source buses 23 and 24 and the wiring 25 corresponds to a portion of the third bus etc., all of which are included in the second layer of the metal wirings. Further, wirings 45, 46, 47, 48, 49 and 50 corresponding to data address buses (of which wirings 47 and 48 are power source wiring) are included in the second layer of the metal wirings extending from the core block to the connection region 11. The data address buses 45–50 are connected to the first through the fourth buses and the power source buses via metal wirings 51, 52, 53, 54, 55 and 56 included in the first layer by using contact regions 57 through 68. As shown in FIG. 4, all of the connections are performed without using excessive regions other than those required to make contacts.

Figure 5:
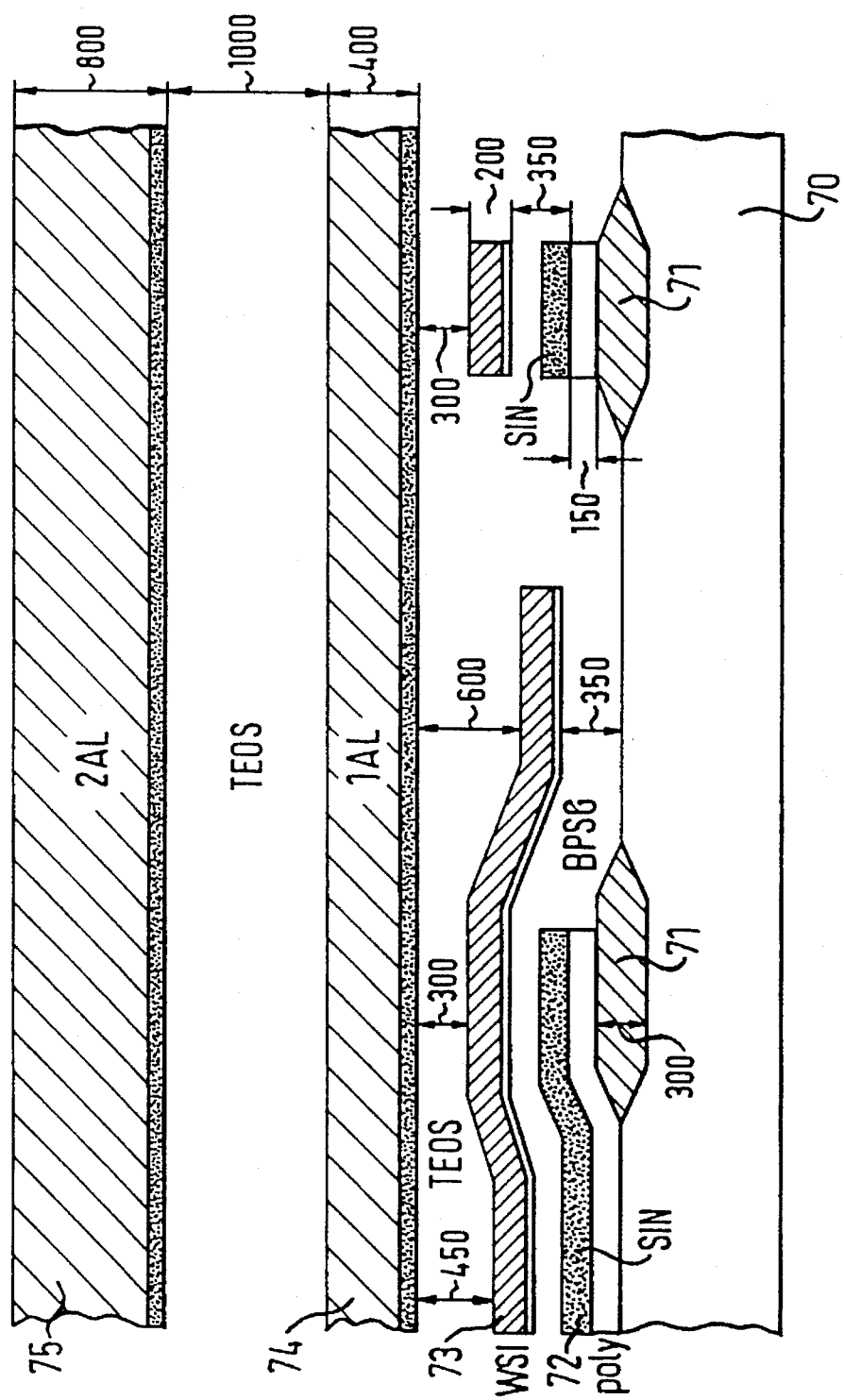
FIG. 5 is a sectional view of a semiconductor memory of the present invention.

FIG. 5 shows a sectional view of a semiconductor memory constructed in accordance with the present invention. Insulation films 71 for separating elements constituted by silicon oxide films are formed with a thickness of approximately 300 nm on a silicon substrate 70 on which a first layer of polysilicon wiring 72 is formed. The polysilicon wiring 72 is constituted by a laminated film of a polysilicon film doped with N-type impurities having a thickness of approximately 150 nm and a silicon nitride film having a predetermined thickness. A second layer of a polysilicon wiring 73 is formed above the polysilicon wiring 72 over a BPSG film having a thickness of approximately 350 nm in sum thereof along with that of the silicon nitride film. The polysilicon wiring 73 is made of tungsten silicide having a thickness of approximately 200 nm. An aluminum wiring film 74 that is a first layer of metal wiring films is formed above the polysilicon wiring 73 over a TEOS oxide film having a thickness of at least approximately 300 nm. The thickness of the aluminum wiring film 74 is approximately 400 nm. An aluminum wiring film 75 having a thickness of approximately 800 nm that is a second layer of metal wiring films is formed above the aluminum wiring layer 74 over a TEOS (tetraethylorthosilicate) oxide film having a thickness of approximately 1000 nm. As shown in FIG. 5, the resistance value per unit length of the second layer 75 of the metal wiring film is far smaller than that of the first layer of the metal wiring film assuming that the wiring width of the second layer is equal to that of the first layer. Most of the major portions of the bus wirings and the major portions of the power source wirings can be formed in the second layer of metal wiring films having a smaller resistance by using the wiring structures as shown in FIG. 3 and FIG. 4 which is preferable in a high-speed DRAM. Further, as shown in FIG. 3 and FIG. 4, the power source wirings are thicker than the bus wirings by which the resistance is decreased, thereby minimizing voltage drop in the wirings.

Figure 6A:
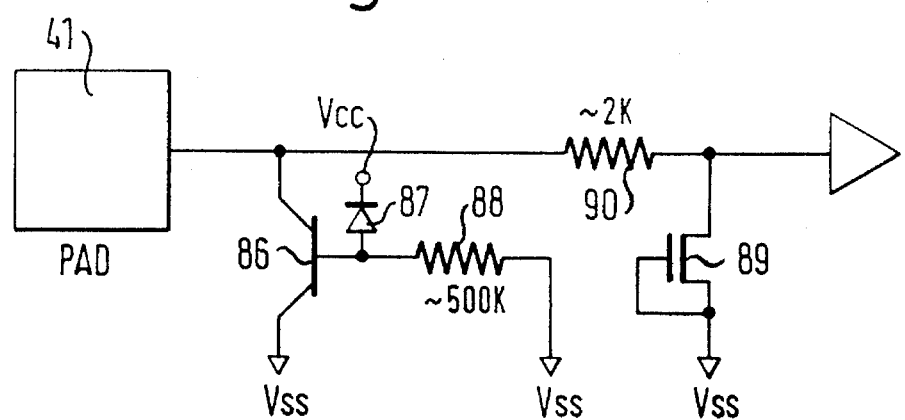
FIGS. 6(a) and 6(b) are a partial circuit diagram and a sectional view of the semiconductor memory of the first embodiment, respectively.
Figure 6B:
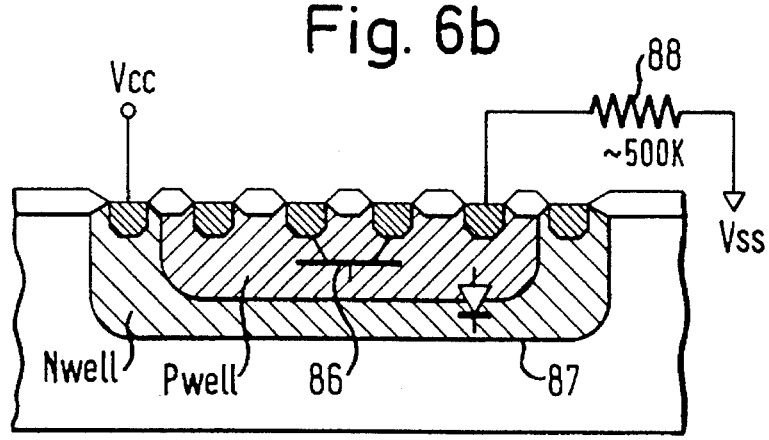

FIGS. 6(a) and 6(b) show an example of an input circuit. In FIG. 3, the input circuit 40 disposed below the buses corresponds to the input pad 41 and is connected thereto. As shown in FIG. 6(a), the input circuit 40 includes a bipolar transistor 86 used for input protection, a parasitic diode 87, a resistor element 88, a MOS transistor 89 and a resistor element 90. FIG. 6(b) shows a sectional view of the bipolar transistor 86 used for input protection, the parasitic diode 87 and the like. As is readily apparent from the drawings, the wiring arrangement of FIG. 3 wherein the power source lines are disposed between the input signal lines and the pad, is preferable for the input circuit of FIG. 6(a) and FIG. 6(b).

Figure 7:
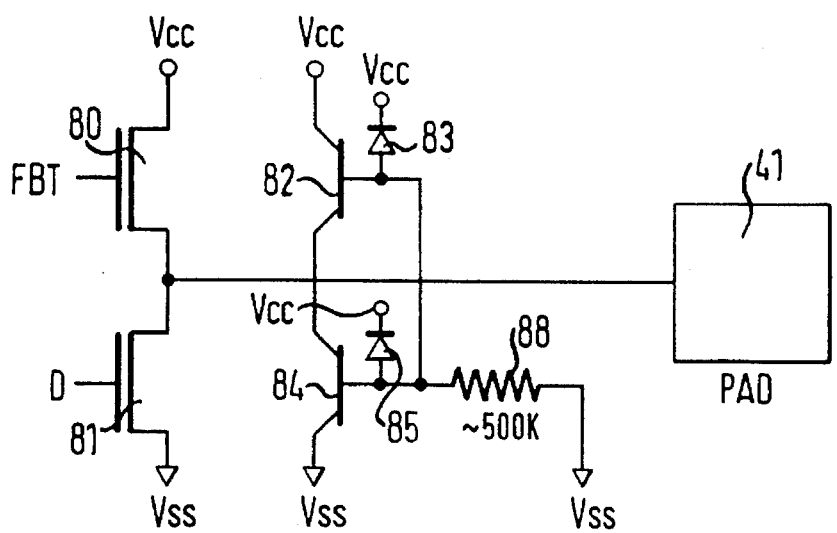
FIG. 7 is a partial circuit diagram of the semiconductor memory of the first embodiment of the present invention.

FIG. 7 shows an example of an output circuit. The output circuit includes MOS transistors 80 and 81 used for driving, bipolar transistors 82 and 84 used for output protection, parasitic diodes 83 and 85, a resistor element 88 and the like. The wiring arrangement of FIG. 3 wherein the power source lines are arranged between the output signal lines and the pad, is more preferable in reducing the area.

As explained above, the connection region 12 is arranged between the second pad array and the inter-block region where the third and fourth buses are jogged and inserted into the space between the first and the second buses. As a result, the four buses extend in parallel with each other, and even when data signal lines, address signal lines and control signal lines extend from any positions in a direction orthogonal to that of the buses, it is possible to connect the signal lines to the buses. It is not necessary to intersect these respective signal lines and to uselessly increase the area for the wiring connection. Further, since the space corresponding to the pads is provided between the first and the second buses, even if the first and the second buses are arranged linearly, it is possible to insert the third and the fourth buses into the space between the first and second buses in the inter-block region by which the arrangement of wirings can be performed within a minimum area. This corresponds to connecting any core blocks to the respective pads with a minimum wiring length which is preferable to increase the speed of the semiconductor memory. A further increase in speed can be achieved since the bus wirings mainly use the second layer of the wiring film having low resistance. Further, it becomes possible to arrange the input/output circuit just below the buses which sufficiently contributes to the reduction in area.

Figure 8:
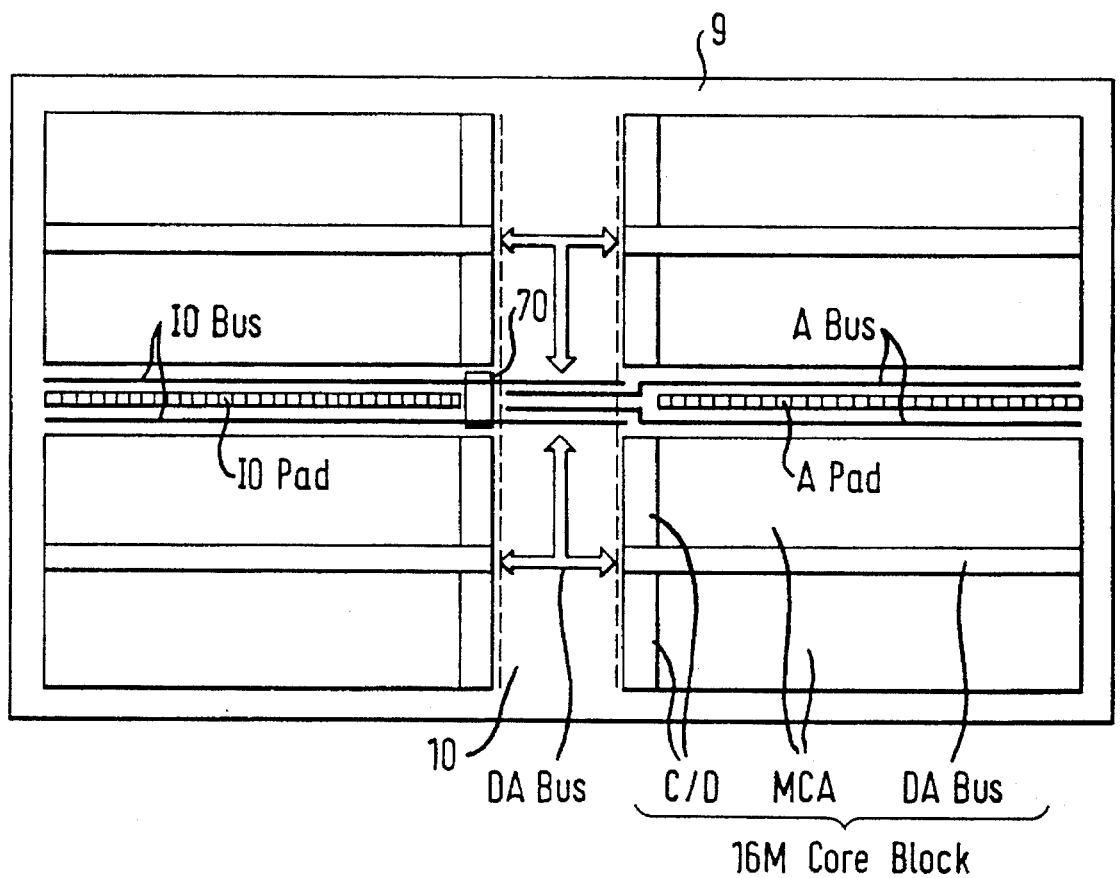
FIG. 8 is a plan view of a semiconductor memory of a second embodiment of the present invention.

Next, an explanation of a second embodiment of the present invention is provided with reference to FIG. 8. A peripheral circuit region 70 is provided in addition to the first embodiment by eliminating a portion of the first pad array. The same notations identify the same portions in FIG. 1 and explanations thereof will be omitted. The peripheral circuit region 70 is a region in which the first through fourth buses gather which is efficient especially when it is used as a test circuit, through the reduction in the chip area.

Figure 9A:
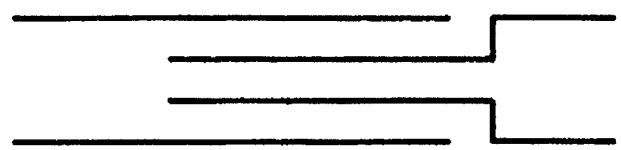
FIGS. 9(a), 9(b), 9(c) and 9(d) are outline views showing various modifying examples of the present invention.
Figure 9B:
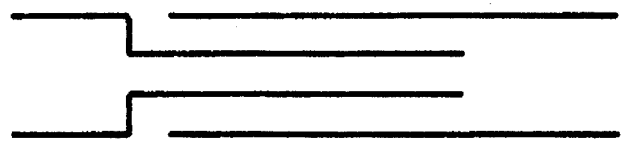
Figure 9C:
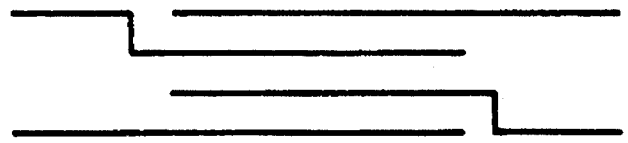
Figure 9D:
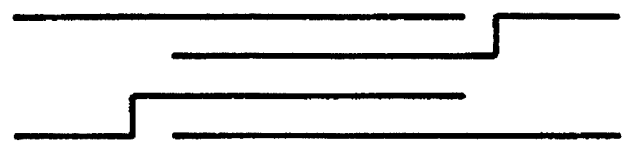

Next, an explanation will be given of modifying examples of the present invention with reference to FIGS. 9(a), 9(b), 9(c) and 9(d). FIG. 9(a) shows an outline of a method of arranging the buses shown in the first embodiment. FIGS. 9(b), 9(c) and (d) are other modifying examples. All of the examples use the connection region 12. In the examples of FIGS. 9(a) and 9(b), it is possible to concentrate the connection region to one side (right side or left side) of the inter-block region 10, further contributing to the reduction in area. The same effect is provided by the examples of FIG. 9(c) and 9(d) as in the other two examples with respect to the ease of making the wiring connections.

Next, an explanation will be given of a third embodiment developed from the first embodiment of the present invention, with reference to FIG. 10 through FIG. 16.

FIG. 10 shows a floor plan of a 64M bits DRAM. Respective notations in the drawing show the following circuit blocks. Vpp Pump designates a boosting circuit for forming a boosted voltage Vpp from a power source voltage Vcc, MUX designates a data multiplexer, CFUSE designates a column fuse, DIB designates a data input buffer, VREF designates a reference voltage generating circuit, SSB designates a substrate potential generation circuit, PWRON designates a power-on reset circuit, CPD designates a column partial decode circuit, RPD designates a row partial decode circuit, ASD designates a column address switch circuit, X1MUX designates an output data multiplexer, I/O buffer designates an output buffer, Data Control designates a data control circuit, RAS series designates a row series control circuit, Address buffer designates an address buffer circuit and Self refresh designates a self-refresh control circuit, respectively.

FIG. 11 shows a pad arrangement of the 64M bits DRAM shown in FIG. 10. The top and the bottom of the drawing are opposite to those of FIG. 10. XN designates that output data is constituted by N bits and is a general description of "X1", "X4", "X8", and "X16", wherein N=1,4, 8, and 16. As shown in FIG. 11, the data pads are arranged between the core blocks 1 and 2 and the address pads and the control signal pads are arranged between the core blocks 3 and 4, respectively. The central portion of the data pad array is slightly off set and the connection region 12 is arranged at the offset location. Accordingly, the structure of the pads as shown in FIG. 11 adopts the wiring arrangement of FIG. 9(b). The following is an explanation of the abbreviations for the pads found in FIG. 11: VBB stands for Voltage of suBstrate Bias; VBL stands for Voltage of Bit Line; VPL stands for Voltage of Plate Line; VPP stands for Voltage which is Pumped-uP; VPPD stands for Voltage which is Dropped from VPP; VDD is the internal power supply voltage; VREFDC stands for Voltage of REFerence (Direct Current); NC stands for No Connection; VCC is an externally supplied power supply voltage; DIN and DOUT stand for Data IN-put and Data OUT-put, respectively; IO1, IO2, IO3, etc. are the Input Output terminals; CAS stands for Column Address Strobe; WE stands for Write Enable; RAS stands for Row Address Strobe; and A0–A12 are the Address terminals.

Figure 12:
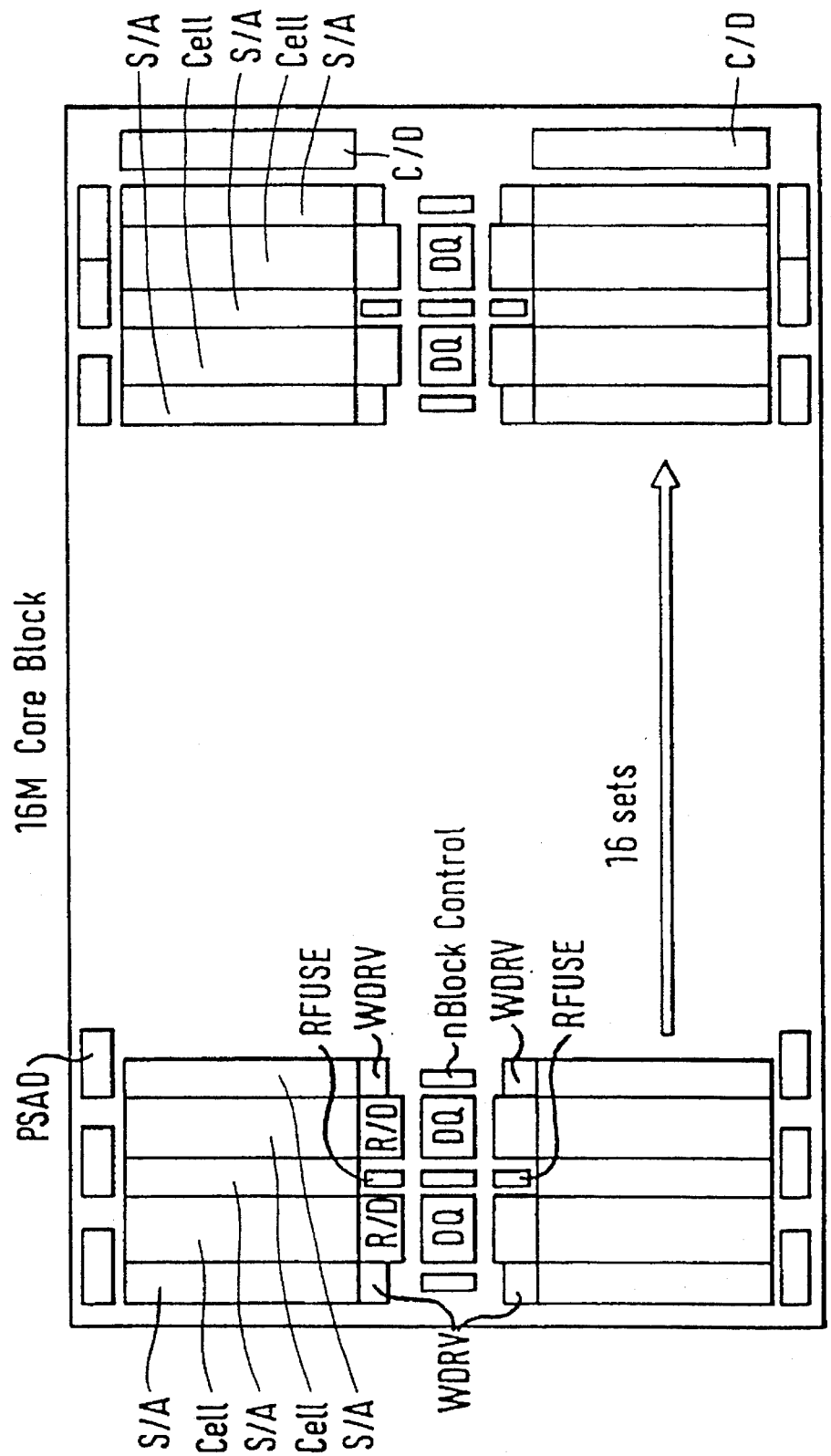
FIG. 12 is a plan view showing in detail portions of FIG. 10.

FIG. 12 shows a portion in FIG. 10 corresponding to one core block of the DRAM by magnifying it. Cell arrays Cell wherein a plurality of DRAM cells are arranged in a matrix and sense amplifier arrays S/A connected to the respective DRAM cells, are arranged in a shared structure. Further, the row decoder R/D is arranged at one end of each cell array Cell and word line drive signal generating circuits WDRV and row fuses R FUSE are alternately arranged among the row decoders. A boosted power source Vpp is used in driving the word lines and a P-channel MOS transistor is used for a charging element on the side of "H" in the word line driving circuit. Data intermediate buffers DQ are arranged in columns between the arrays divided into op and bottom portions. Data signal lines, address signal lines, control signal lines and power source lines run in the left and right direction on the data intermediate buffers DQ, pass between the column decoders C/D and proceed toward the inter-block region 10. The n Block Controls select a memory cell array which is represented as "Cell" in FIG. 12. In the DRAM, "n Block Control" selects one array (Cell) from 64 arrays within one core block (16M Core Block). The row decoder (R/D) selects one row of memory cells within an array. The column decoder (C/D) selects one column. "16 sets" indicates that the structure of four cell arrays, four Row Decoders and two DQs (data buffers) repeats sixteen times.

FIG. 13 through 16 are plan views showing respective arrangements of electrode wirings Vcc, ground wirings Vss, internal power source wirings VDD and internal boost power source wirings Vpp, respectively.

Figure 13:
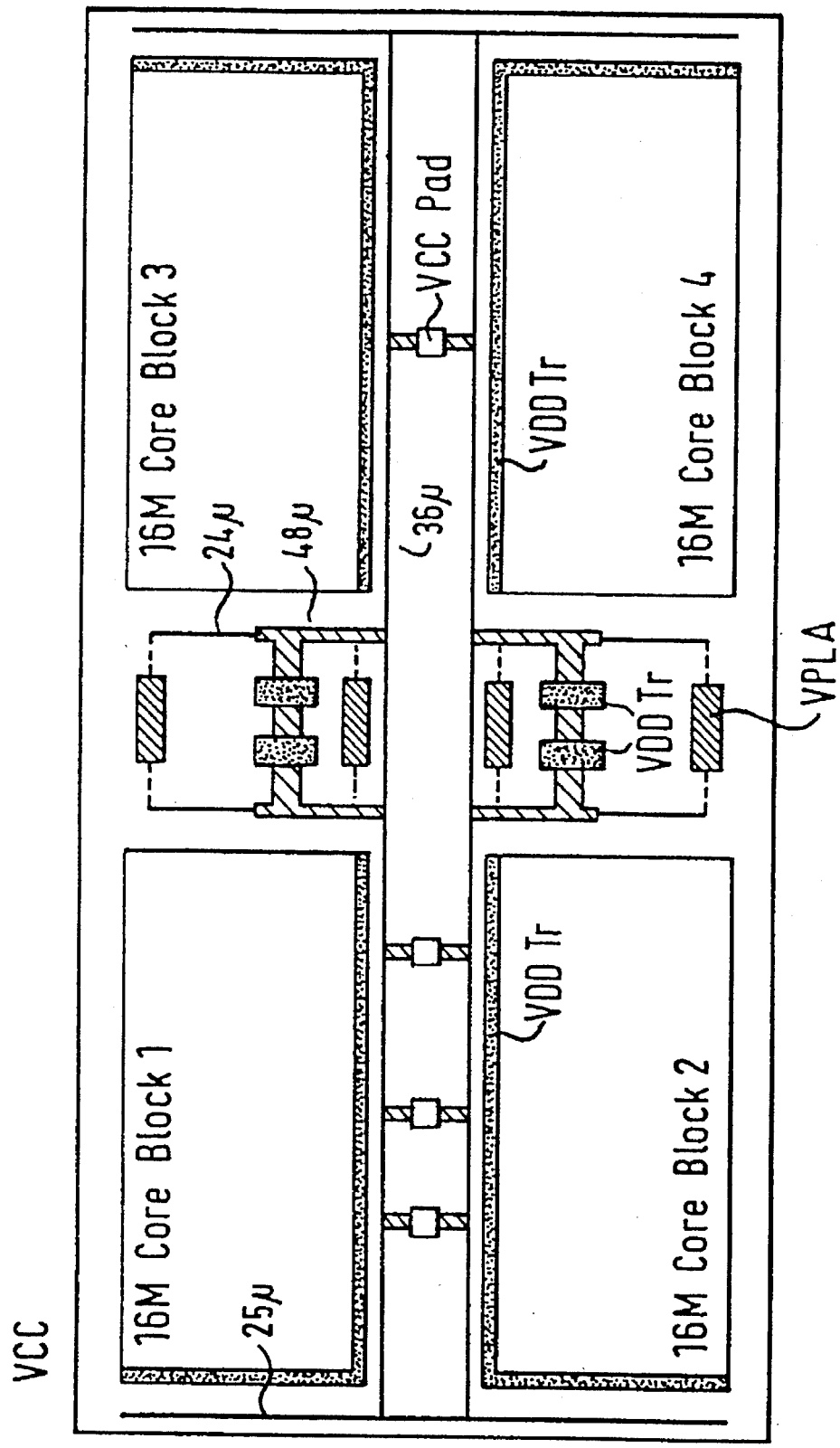
FIG. 13 is a plan view showing an allocation of power source wirings Vcc in the semiconductor memory of FIG. 10.

The designation of dimensions, e.g., 25 u etc., in FIG. 13 signifies a width of wiring denoted by μm unit. Portions shown in bold lines are portions using the second layer of the metal wirings and the other portions are portions using the first layer of the metal wirings. VDD Tr designates transistors each for forming the internal power source voltage VDD from the power source Vcc inputted from the outside, four of which are arranged in the inter-block region and the others of which are arranged at two sides of the core blocks respectively in a L-shape. VPLA designates a charge pump circuit of the Vpp boosting circuit.

Figure 14:
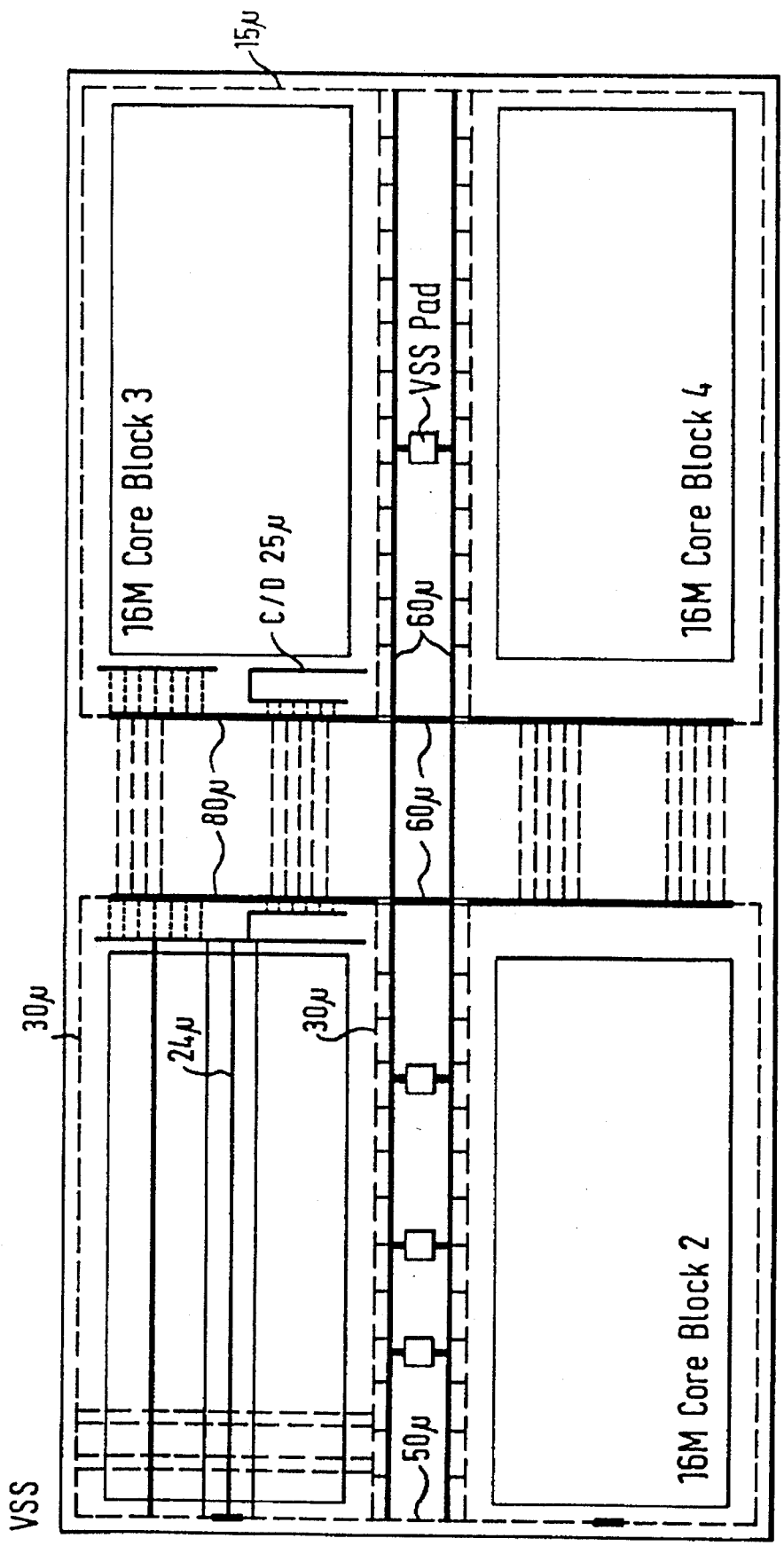
FIG. 14 is a plan view showing an allocation of ground wirings Vss in the semiconductor memory of FIG. 10.
Figure 15:
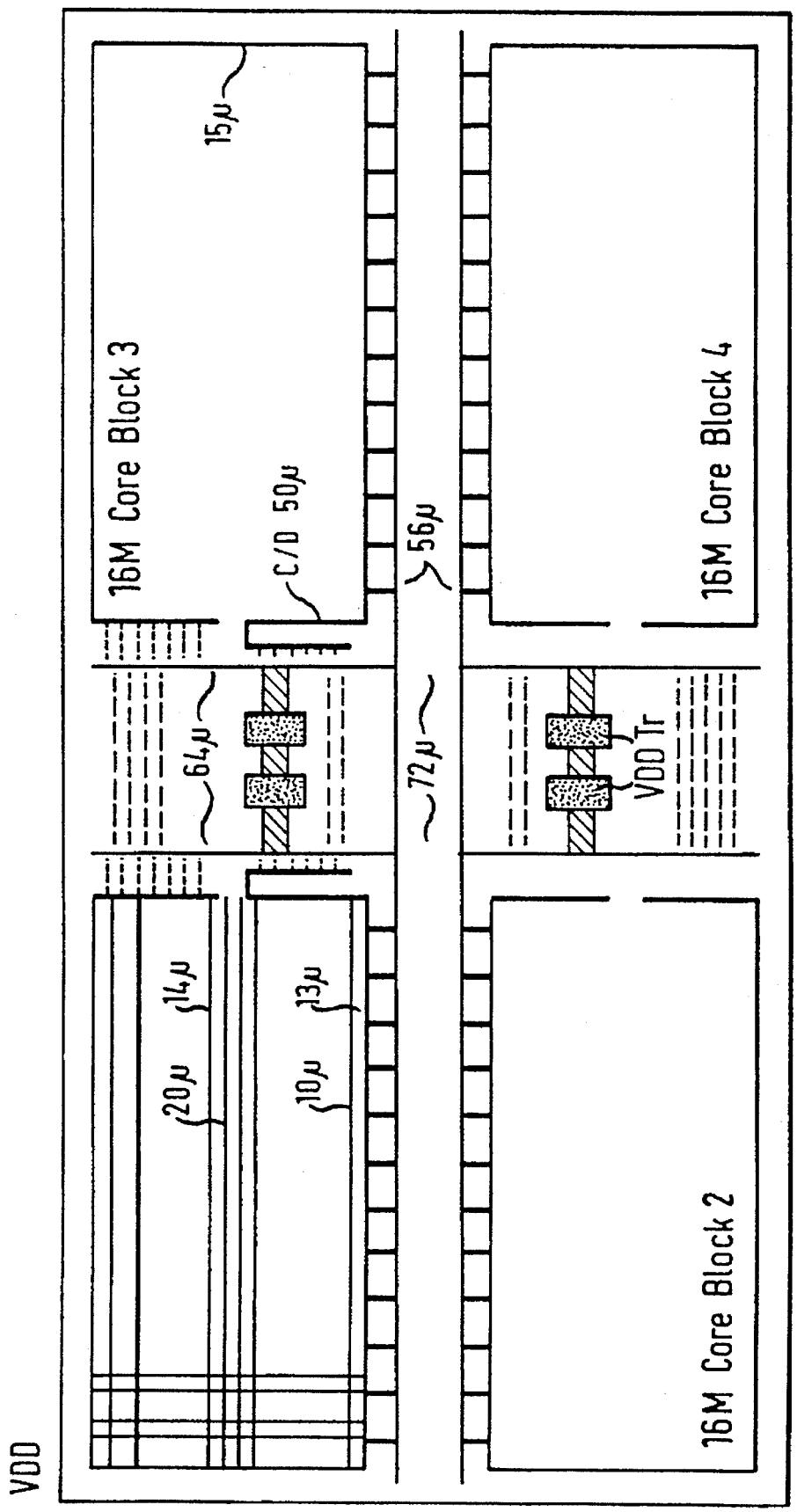
FIG. 15 is a plan view showing an allocation of inner source wirings VDD in the semiconductor memory of FIG. 10.
Figure 16:
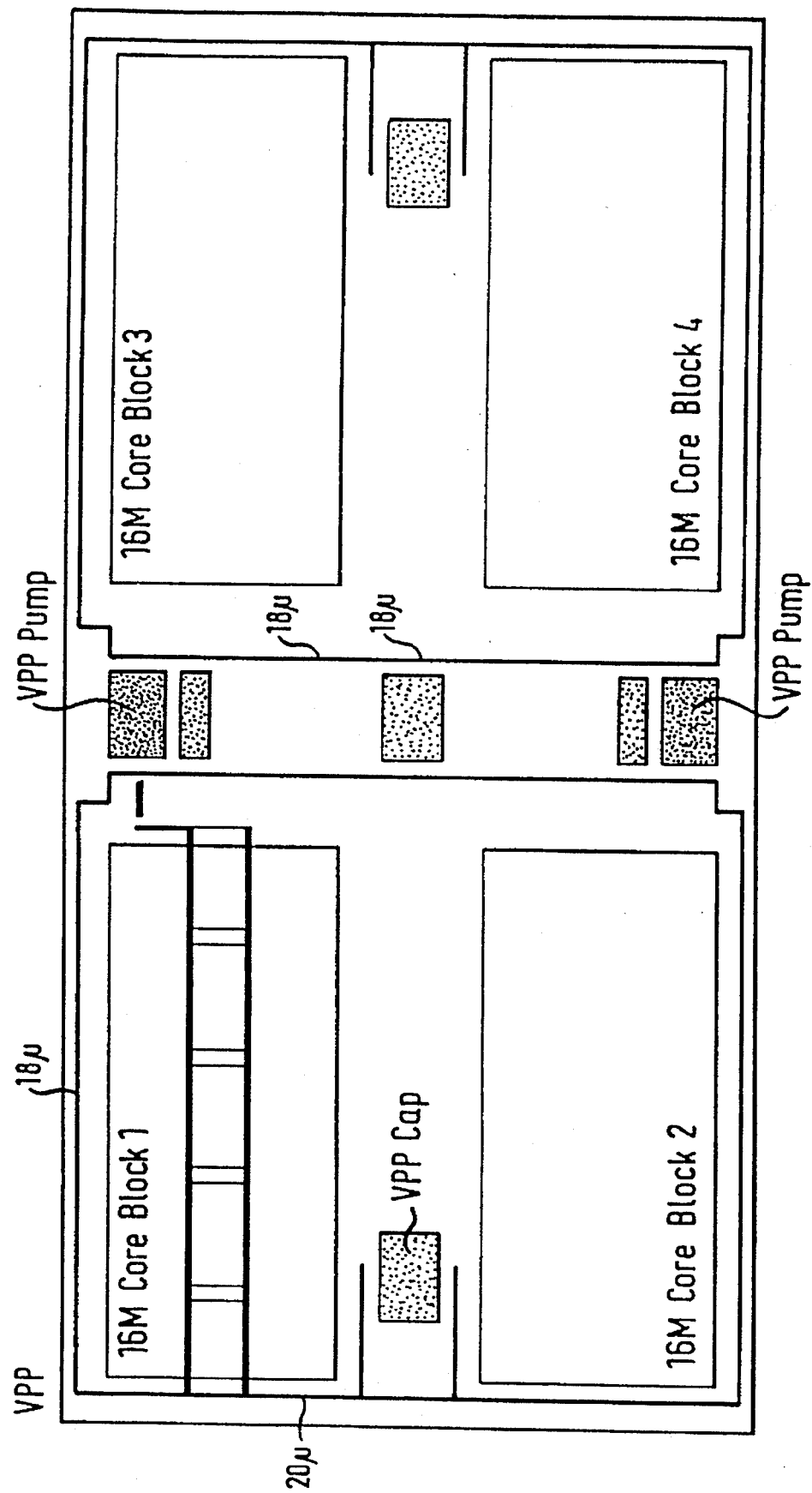
FIG. 16 is a plan view showing an allocation of inner boosted power source wirings Vpp in the semiconductor memory of FIG. 10.

As shown in FIG. 14 and FIG. 15, the ground wirings Vss and the internal power source wirings VDD are arranged on the core blocks in a mesh-like shape supplying the power sources to the sense amplifier circuits, the decoder circuits and the like in the respective core blocks. Further, as shown in FIG. 16, the internal boosted power source wirings Vpp are connected to Vpp CAP which are stabilizing capacitance elements by detouring through the outer peripheral portions of the core blocks to avoid the bus wirings on both sides of the pad arrays. Some of the stabilizing capacitance elements are respectively arranged between the core blocks 1 and 2 and the core blocks 3 and 4.

The above structure makes possible the wiring arrangements of the power source lines, the signal line and the like in a manner preferable for DRAMs, and can achieve speedup, reduction in the chip area and high reliability through the reduction in noise which is especially preferable to a DRAM driven by a low power source voltage.

Further, although an explanation has been given for a semiconductor memory constituted by the four core blocks, the present invention is naturally applicable to a memory cell array constitution having any number of divisions, for example 8 or 16 so far as it is of the center pad allocation type. The present invention is applicable not only to a semiconductor memory using two layers of metal wirings but to a semiconductor memory using metal wirings of three layers or more.

The present invention provides a high-speed semiconductor memory which makes possible an efficient wiring even when using center pad allocation and wherein a number of signal wirings are provided within a small area.

What is claimed is:

1. A semiconductor memory comprising:
   a first, a second, a third and a fourth core blocks each comprising a memory cell array wherein a plurality of memory cells are arranged in a matrix and sense amplifiers and decoders accompanying the memory cell array;
   an inter-block region arranged between the first and the second core blocks and the third and the fourth core blocks wherein data signal lines, address signal lines and control signal lines are arranged;
   a first pad array comprising a plurality of pads arranged between the first and the second core blocks;
   a second pad array comprising a plurality of pads arranged between the third and the fourth core blocks;
   first and second buses extending to the inter-block region along both sides of the first pad array;
   third and fourth buses extending to the inter-block region along both sides of the second pad array; and
   a connection region arranged between the second pad array and the inter-block region;
   wherein the third and the fourth buses are jogged in the connection region to pass between the first and second buses in the inter-block region, the data signal lines, the address signal lines and the control signal lines being connected to the first, the second, the third and the fourth buses in the inter-block region.

2. The semiconductor memory according to claim 1, further comprising:
   a first power source bus linearly extending between the first pad array and the first bus, in the inter-block region, in the connection region and between the second pad array and the third bus;
   a second power source bus linearly extending between the first pad array and the second bus, in the inter-block region, in the connection region and between the second pad array and the fourth bus; and
   wherein the first bus, the first power source bus, the third bus, the fourth bus, the second power source bus and the second bus are arranged in this sequence in the inter-block region.

3. The semiconductor memory according to claim 2, wherein the data signal lines, the address signal lines, the control signal lines, the first bus, the second bus, the third bus, the fourth bus, the first power source bus and the second power source bus are formed with a first wiring layer, and connection portions of the first through the fourth buses which are at locations of intersections with the first and the second power source buses, respectively, in the connection region are formed with a second wiring layer which is below the first wiring layer.

4. The semiconductor memory according to claim 3, wherein a first resistance of the first wiring layer is larger than a second resistance of the second wiring layer.

5. The semiconductor memory according to claim 2, wherein input/output protection circuits each corresponding to each pad are arranged below the first, the second, the third and the fourth buses and the input/output protection circuits are supplied with power sources from the first or the second power source bus.

6. The semiconductor memory according to claim 1, further comprising a circuit region between the first pad array and the inter-block region.

7. The semiconductor memory according to claim 1, wherein each of the first, the second, the third and the fourth core blocks is separated into N array regions in parallel with the first and the second pad arrays, the data signal lines, the address signal lines and the control signal lines being arranged in the respective separated array regions.

8. The semiconductor memory according to claim 7, wherein N is 2.

9. The semiconductor memory according to claim 2, wherein a third resistance of the first and the second power source buses is smaller than a fourth resistance of the first, the second, the third and the fourth buses.

10. A semiconductor device comprising:
    a first pad array having a plurality of bonding pads arranged linearly;
    a second pad array having a plurality of bonding pads arranged linearly, wherein the bonding pads in the first pad array and the bonding pads in the second pad array are in line;
    a first bus arranged beside the first pad array, extending into an inter-pad region between ends of the first pad array and the second pad array; and
    a second bus arranged beside the second pad array and being jogged near the end of the second pad array to extend into the inter-pad region arranged beside the first bus in the inter-pad region.

11. The semiconductor device according to claim 10 further comprising:
    a third bus arranged beside the first pad array at a side opposite to that of the first bus, and extending into the inter-pad region; and
    a fourth bus arranged beside the second pad array at a side opposite to that of the second bus, and being jogged near the end of the second pad array to extend into the inter-pad region arranged beside the third bus in the inter-pad region.

12. The semiconductor device according to claim 10 further comprising:
    a third bus arranged beside the first pad array at a side opposite to that of the first bus, and jogged near the end of the first pad array, and extending in the inter-pad region; and
    a fourth bus arranged beside the second pad array at a side opposite to that of the second bus to extend into the inter-pad region and arranged beside the third bus in the inter-pad region.

13. A semiconductor device comprising:

a first bus;

a second bus arranged parallel to the first bus;

a first pad array located between the first and second buses, the first pad array having a plurality of bonding pads arranged linearly;

a second pad array located between the first and second buses, the second pad array having a plurality of bonding pads arranged linearly, a connection region between the first pad array and the second pad array;

a third bus arranged along a side of the first bus remote from the first pad array, the third bus extending beside the first pad array and into the connection region;

a fourth bus arranged along a side of the second bus remote from the first pad array, the fourth bus extending beside the first pad array and into the connection region;

a fifth bus arranged along a side of the first bus remote from the second pad array, the fifth bus extending beside the second pad array;

a sixth bus arranged along a side of the second bus remote from the second pad array, the sixth bus extending beside the second pad array;

seventh and eighth buses positioned between the first and the second buses in the connection region;

a first connection path for electrically connecting the fifth bus and the seventh bus near an end of the second pad array proximate the connection region; and a second connection path for electrically connecting the sixth bus and the eighth bus at the edge of the second pad array.

14. The semiconductor device according to claim 13, wherein the first to the eighth buses are made of metal wirings in a first metal layer, and the first and the second connection paths are made of metal wirings in a second metal layer which is below the first metal layer.

15. The semiconductor device according to claim 14, wherein the widths of signal lines of the first and the second buses is larger than the widths of signal lines of the third to the eighth buses.

16. The semiconductor device according to claim 13, further comprising a plurality of I/O circuits each located under ones of the first to sixth buses.

17. A semiconductor device comprising:

a first bus;

a second bus arranged in parallel to the first bus;

a first pad array located between the first and second buses, the first pad array having a plurality of bonding pads arranged linearly;

a second pad array located between the first and second buses, the second pad array having a plurality of bonding pads arranged linearly, a connection region between the first pad array and the second pad array;

a third bus arranged along a side of the first bus remote from the first pad array, the third bus extending beside the first pad array and into the connection region;

a fourth bus arranged along a side of the second bus remote from the second pad array, the fourth bus extending beside the second pad array and into the connection region;

a fifth bus arranged along a side of the first bus remote from the second pad array, the fifth bus extending beside the second pad array;

a sixth bus arranged along a side of the second bus remote from the first pad array, the sixth bus extending beside the first pad array;

seventh and eighth buses positioned between the first and the second buses in the connection region a first connection path for electrically connecting the fifth bus and the seventh bus near an end of the second pad array proximate the connection region; and a second connection path for electrically connecting the sixth bus and the eighth bus near the end of the first pad array proximate the connection region.

18. The semiconductor device according to claim 17, wherein the first to the eighth buses are made of metal wirings in a first metal layer, and the first and the second connection paths are made of metal wirings in a second metal layer which is below the first metal layer.

19. The semiconductor device according to claim 18, wherein the widths of signal lines of the first and the second buses is larger than the widths of signal lines of the third to the eighth buses.

20. The semiconductor device according to claim 17, further comprising a plurality of I/O circuits each located under ones of the first to sixth buses.

* * * * *

UNITED STATES PATENT AND TRADEMARK OFFICE
CERTIFICATE OF CORRECTION

PATENT NO. : 5,619,472
DATED : April 08, 1997
INVENTOR(S) : Junichi OKAMURA

It is certified that error appears in the above-indentified patent and that said Letters Patent is hereby corrected as shown below:

Claim 17, column 12, line 26, after "region", insert --;--.

Signed and Sealed this

Seventh Day of October, 1997

Attest:

BRUCE LEHMAN

Attesting Officer

Commissioner of Patents and Trademarks